(12) United States Patent
Huang

(10) Patent No.: US 7,990,800 B2
(45) Date of Patent: Aug. 2, 2011

(54) CIRCUIT AND METHOD FOR CONTROLLING DRAM COLUMN-COMMAND ADDRESS

(75) Inventor: Yu-Wen Huang, Hsinchu (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 166 days.

(21) Appl. No.: 12/417,338

(22) Filed: Apr. 2, 2009

(65) Prior Publication Data

US 2010/0177587 A1     Jul. 15, 2010

(30) Foreign Application Priority Data

Jan. 14, 2009    (TW) ................................ 98101294 A

(51) Int. Cl.
*G11C 8/00*      (2006.01)
(52) U.S. Cl. ............ 365/230.08; 365/230.01; 365/233.1; 365/149; 365/189.02; 365/189.15; 365/189.16; 365/189.05; 365/189.12; 365/230.06

(58) Field of Classification Search ............. 365/230.08, 365/230.01, 233.1, 149, 189.02, 189.15, 365/189.16, 189.05, 189.12, 230.06, 233.11, 365/133.13, 239, 240
See application file for complete search history.

(56) References Cited

U.S. PATENT DOCUMENTS

| | | | |
|---|---|---|---|
| 2004/0039874 A1* | 2/2004 | Johnson ........................ | 711/105 |
| 2005/0270852 A1* | 12/2005 | Dietrich et al. .......... | 365/189.01 |
| 2010/0005250 A1* | 1/2010 | Simon et al. .................. | 711/154 |

* cited by examiner

*Primary Examiner* — Hoai V Ho
*Assistant Examiner* — Fernando N Hidalgo
(74) *Attorney, Agent, or Firm* — Volpe and Koenig, P.C.

(57) ABSTRACT

The present invention provides a circuit for controlling a column-command address corresponding to a specific column of a DRAM array. The circuit includes a control unit and a FIFO register. The control unit determines a period number, and synchronously produces an input pointer and an output pointer, wherein the output pointer is lagged behind the input pointer by the period number. The FIFO register utilizes the input pointer to store the column-command address, and utilizes the output pointer to output the column-command address.

16 Claims, 6 Drawing Sheets

CIRCUIT AND METHOD FOR CONTROLLING DRAM COLUMN-COMMAND ADDRESS

FIELD OF THE INVENTION

The present invention relates to a circuit and method for controlling a column-command address, and more particularly to a circuit and method for controlling a column-command address of a double data rate synchronous dynamic random access memory (DDR SDRAM) device.

BACKGROUND OF THE INVENTION

Please refer to FIG. 1, which is a schematic diagram showing a conventional double data rate synchronous dynamic random access memory (DDR SDRAM) device 10 having latency control for a column-command address thereof. As shown, the DDR SDRAM device includes a read-command decoder 121, an address input buffer 122, a write-command decoder 123, a mode register 124, a processing device 13, a column address decoder 14 and a memory array 15. The memory array 15 is a DDR SDRAM array including plural memory cells (not shown) disposed into rows and columns. The column address decoder 14 receives an address signal LDS1 output from the processing device 13, and produces a driving signal CSL1 used for controlling the memory array 15, wherein the address signal LDS1 includes a column-command address AS1 used for pointing at a specific memory cell of the plural memory cells.

The processing device 13 includes a read-address latch device 131, a write-address register 132 and a latch unit 133. The input terminal 133A of the latch unit 133 is electrically connected to the output terminal 131B of the read-address latch device 131 and the output terminal 132B of the write-address register 132, and the input terminal 133A of the latch unit 133 has an address signal KDS1.

The mode register 124 receives a mode register set command MRS1 to produces a write latency WL1 being a value. The address input buffer 122 receives an input address signal CDS1 and produces an internal address signal IDS1, wherein the internal address signal IDS1 is lagged behind the input address signal CDS1 by a buffer delay time.

A read operation of the DDR SDRAM device 10 is taken as an example. In a first clock period, the read-command decoder 121 receives a read command RCM1 and the address input buffer 122 receives the column-command address AS1, which corresponds to the read command RCM1, of the input address signal CDS1. The read-command decoder 121 produces a read timing signal CKR1 in response to the read command RCM1. The read-address latch device 131 contributes to the address signal KDS1 in response to the read timing signal CKR1 and the internal address signal IDS1. The latch unit 133 receives the address signal KDS1 and produces the address signal LDS1. Each of the input address signal CDS1, the internal address signal IDS1, the address signal KDS1 and the address signal LDS1 includes the column-command address AS1, but the time points that the column-command address AS1 is loaded into those signals are different.

A write operation of the DDR SDRAM device 10 is taken as an example. In a second clock period, the write-command decoder 123 receives a write command WCM1 and the address input buffer 122 receives a column-command address AS2, corresponding to the write command WCM1, of the input address signal CDS1. The write-command decoder 123 produces a write timing signal CKW1 in response to the write command WCM1. The write-address register 132 contributes to the address signal KDS1 in response to the write timing signal CKW1 and the internal address signal IDS1 and the write latency WL1. The latch unit 133 receives the address signal KDS1 and produces the address signal LDS1.

Please refer to FIG. 2, which is a schematic diagram showing a circuit of the processing device 13 in FIG. 1. As shown, the processing device 13 includes the read-address latch device 131, the write-address register 132 and the latch unit 133. The read-address latch device 131 includes two switches 21 and 22, a NOT gate 1311 and a latch unit 31. The NOT gate 1311 receives the read timing signal CKR1 and produces a signal BCLKR1. The input terminal 21A of the switch 21 receives the internal address signal IDS1; the control terminal 21C of the switch 21 receives the read timing signal CKR1; the input terminal 31A of the latch unit 31 is electrically connected to the output terminal 21B of the switch 21. The input terminal 22A of the switch 22 is electrically connected to the output terminal 31B of the latch unit 31; the control terminal 22C of the switch 22 receives the signal BCKR1; the output terminal 22B of the switch 22 contributes to the address signal KDS1. The switch 21 includes a transmission gate 211 and a NOT gate. The latch unit 31 includes a NOT gate 311 and a NOT gate 312 connected in parallel with the NOT gate 311 in the state of the opposite direction thereof. The switches 21 and 22 have the same structure.

The read timing signal CKR1 has a low logical level in a first time interval, e.g. the first time interval is in the first clock period. In the first time interval, the column-command address AS1 of the internal address signal IDS1 is written into the latch unit 31 through the transmission gate 211. The read timing signal CKR1 has a high logical level in a second time interval following the first time interval. In the second time interval, the column-command address AS1 at the output terminal 31B of the latch unit 31 is written into the latch unit 133 through the transmission gate 221, which causes the address signal LDS1 to carry the column-command address AS1.

The write-address register 132 includes a NOT gate 1321, six switches 23, 24, 25, 26, 27 and 28, five latch units 32, 33, 34, 35 and 36, and a multiplexing device 39. The five latch units 32, 33, 34, 35 and 36 and the six switches 23, 24, 25, 26, 27 and 28 are connected in series in the sequence of the component references 23, 32, 24, 33, 25, 34, 26, 35, 27, 36 and 28. The NOT gate 1321 receives the write timing signal CKW1 and produces a signal BCKW1. The input terminal 23A of the switch 23 receives the internal address signal IDS1; each of the control terminal 23C of the switch 23, the control terminal 25C of the switch 25 and the control terminal 27C of the switch 27 receives the signal BCKW1; the output terminal 24B of the switch 24, the output terminal 26B of the switch 26 and the output terminal 28B of the switch 28 produce plural signals JS11, JS12 and JS13 respectively, wherein the signal JS12 is lagged behind the signal JS11 by a clock period, and the signal JS13 is lagged behind the signal JS12 by a clock period.

The write timing signal CKW1 has three sequential low logical levels in a third, a fourth and a fifth time intervals. In the third, the fourth and the fifth time intervals, the internal address signal IDS1, the latch unit 33 and the latch unit 35 have the column-command address AS2 respectively. In the third, the fourth and the fifth time intervals, the column-command address AS2 is sequentially written into the latch units 32, 34 and 36 through the switches 23, 25 and 27. The write timing signal CKW1 has three sequential high logical levels in a sixth, a seventh and an eighth time intervals. In the sixth, the seventh and the eighth time intervals, the latch units 32, 34 and 36 have the column-command address AS2 respectively. In the sixth, the seventh and the eighth time intervals, the column-command address AS2 is sequentially written into the latch unit 33, the latch unit 35 and the output terminal 28B of the switch 28 through the switches 24, 26 and 28, wherein the third, the six, the fourth, the seventh, the fifth and the eighth time intervals are six sequential time intervals.

The multiplexing device 39 receives the write latency WL1 and the signals JS1, JS12 and JS13, and selects one of the signals JS1, JS12 and JS13 to contribute to the address signal KDS1 according to the write latency WL1. The latch unit 133 receives the address signal KDS1 and produces the address signal LDS1. When the value of the write latency WL1 is changed, the time point to load the column-command address AS2 into the address signal LDS1 can also be changed.

In FIG. 1 and FIG. 2, the DDR SDRAM device 10 uses shift registers to control the column-command address AS1 and the column-command address AS2, which corresponds to the read command RCM1 and the write command WCM1 respectively. Because the latency of the read operation is different from that of the write operation, two different register paths are necessary for the read operation and the write operation. Therefore, how to further integrate the two different register paths for simplifying the column-command address control becomes the requirement on the development.

SUMMARY OF THE INVENTION

It is an object of the present invention to provide a circuit and method for controlling a column-command address. The latency controls of the column-command addresses for the read operations and the write operations of the DRAM device are integrated by using a control unit and a first-in first-out (FIFO) register so as to accomplish the effect of simplifying the circuit design.

It is therefore a first aspect of the present invention to provide a circuit for controlling a column-command address corresponding to a specific column of a dynamic random access memory (DRAM) array. The circuit includes a control unit and a FIFO register. The control unit sets at least one of a read latency and a write latency to determine a period number, and synchronously produces an input pointer and an output pointer, wherein the output pointer is lagged behind the input pointer by the period number. The FIFO register has plural sequential latch units including a specific latch unit, receives the column-command address and the input and the output pointers, writes the column-command address into the specific latch unit, and reads the specific latch unit to output the column-command address by using the output pointer, wherein the input pointer is pointed at the specific latch unit.

It is therefore a second aspect of the present invention to provide a circuit for controlling a column-command address corresponding to a specific column of a DRAM array operating in synchronization with a clock signal. The method includes the following steps. Plural sequential storage positions are provided. A period number of the clock signal is determined. An input pointer and an output pointer is synchronously produced in response to the clock signal, wherein the output pointer is lagged behind the input pointer by the period number, and each of the input pointer and the output pointer is sequentially pointed at the plural sequential storage positions. The input pointer is utilized to store the column-command address. In addition, the output pointer is utilized to output the column-command address.

It is therefore a third aspect of the present invention to provide a circuit for controlling a column-command address corresponding to a specific column of a DRAM array. The circuit includes a control unit and a FIFO register. The control unit determines a period number, and synchronously produces an input pointer and an output pointer, wherein the output pointer is lagged behind the input pointer by the period number. The FIFO register utilizes the input pointer to store the column-command address, and utilizes the output pointer to output the column-command address.

BRIEF DESCRIPTION OF THE DRAWINGS

The foregoing and other features and advantages of the present invention will be more clearly understood through the following descriptions with reference to the drawings, wherein.

DETAIL DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
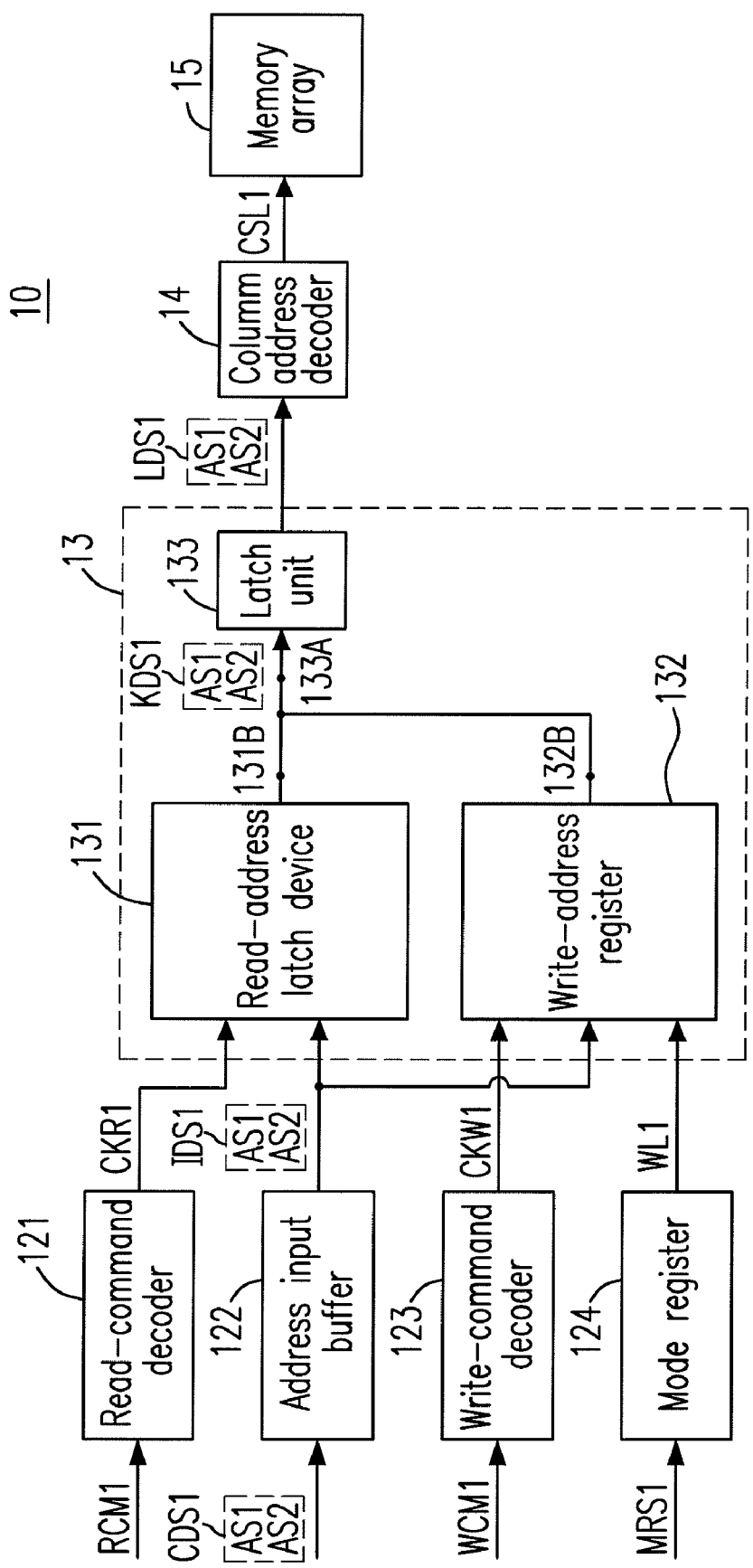
FIG. 1 is a schematic diagram showing a conventional DDR SDRAM device having latency control for a column-command address thereof.
Figure 2:
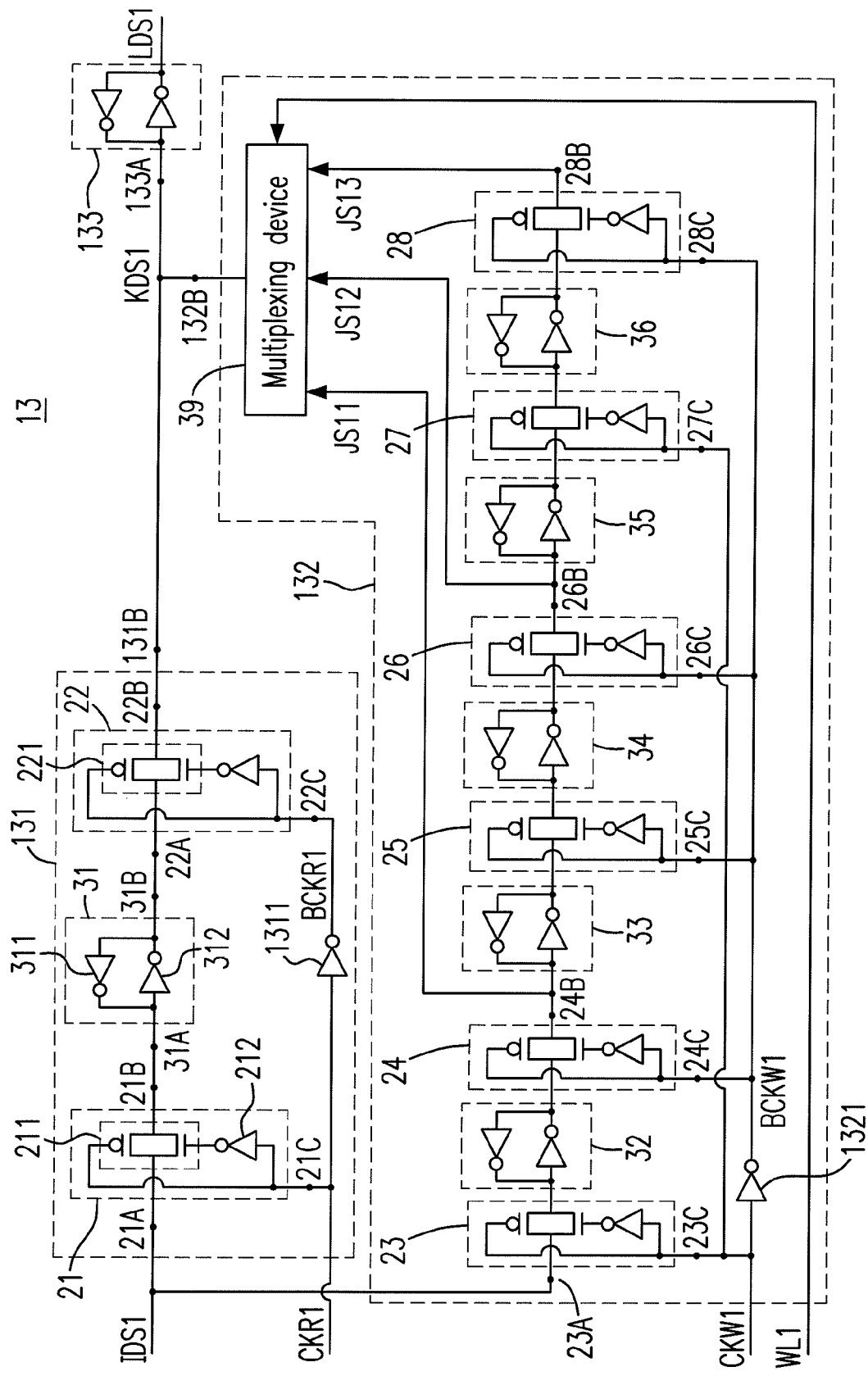
FIG. 2 is a schematic diagram showing a circuit of a processing device in FIG. 1.
Figure 3:
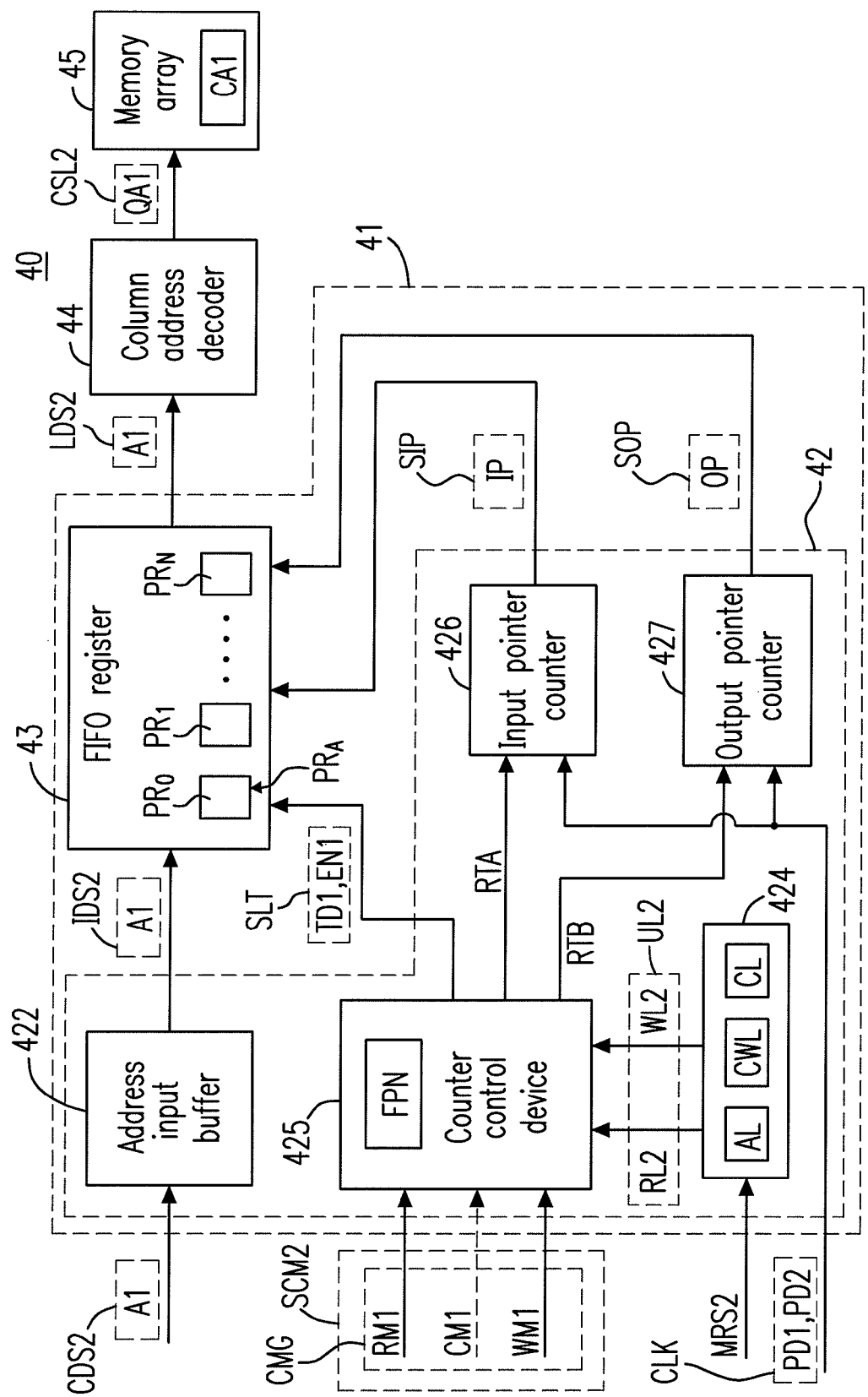
FIG. 3 is a schematic diagram showing a DRAM device according to the present invention.

Please refer to FIG. 3, which is a schematic diagram showing a DRAM device 40 according to the present invention. As shown, the DRAM device 40 includes a control circuit 41, a column address decoder 44 and a memory array 45. In an embodiment, the control circuit 41 is used for controlling a column-command address A1, wherein the column-command address A1 corresponds to a specific column CA1 of the memory array 45, and the memory array 45 is a DRAM array. The control circuit 41 may includes a control unit 42 and a first-in first-out (FIFO) register 43. The control unit 42 determines a period number FPN, and synchronously produces an input pointer IP and an output pointer OP, wherein the output pointer OP is lagged behind the input pointer IP by the period number FPN. The FIFO register 43 utilizes the input pointer IP to store the column-command address A1, and utilizes the output pointer OP to output the column-command address A1.

The memory array 45 includes plural memory cells (not shown) disposed into rows and columns, wherein the columns include the specific column CA1. In an embodiment, the memory array 45 is a DDR SDRAM array. The column address decoder 44 receives the column-command address A1, and produces a driving command QA1 according to the column-command address A1, wherein the driving command QA1 is provided to the memory array 45 and is used to select the specific column CA1 of the memory array 45.

In an embodiment, the control unit 42 sets at least one of a read latency RL2 and a write latency WL2 to determine a period number FPN, and synchronously produces an input pointer IP and an output pointer OP, wherein the output pointer OP is lagged behind the input pointer IP by the period number FPN. The FIFO register 43 has plural sequential latch units $PR_0, PR_1, \ldots$ and $PR_N$ including a specific latch unit $PR_A$ (e.g. $PR_0$). The FIFO register 43 receives the column-command address A1, the input pointer IP and the output pointer OP, writes the column-command address A1 into the specific latch unit $PR_A$ (e.g. $PR_0$), and reads the specific latch unit $PR_A$ (e.g. $PR_0$) to output the column-command address OP by using the output pointer OP, wherein the input pointer IP is pointed at the specific latch unit $PR_A$ (e.g. $PR_0$).

In an embodiment, the control unit 42 is used for controlling the FIFO register 43. The control unit 42 produces an internal address signal IDS2, a pointer signal SIP, a pointer signal SOP and a latch signal SLT in response to a clock signal CLK, a command signal SCM2, an input address signal CDS2 and the period number FPN, wherein the clock signal CLK has a clock period PD1 and a clock period PD2 lagged behind the clock period PD1 by the period number FPN, and the internal address signal IDS2, the pointer signal SIP, the pointer signal SOP and the latch signal SLT are provided to the FIFO register 43. Each of the input address signal CDS2 and the internal address signal IDS2 includes the column-command address A1, the pointer signal SIP includes the input pointer IP, and the pointer signal SOP includes the output pointer OP. The FIFO register 43 produces address signal LDS2 including the column-command address A1 in response to the internal address signal IDS2, the pointer signal SIP, the pointer signal SOP and the latch signal SLT. The column address decoder 44 receives the column-command address LDS2, and produces a driving signal CSL2 used for controlling the memory array 45, wherein the driving signal CSL2 includes the driving command QA1.

The operations of the DRAM device 40 may be synchronized with the clock signal CLK. The DRAM device 40 utilizes a series of plural access commands of the command signal SCM2 to perform a series of plural access operations. The plural access commands include plural read commands and plural write commands, and the plural access operations include plural read operations and plural write operations. The plural read commands is used for performing the plural read operations, and the plural write commands is used for performing the plural write operations. Plural latencies of plural column-command addresses correspond to the plural access commands, and the plural latencies may be controlled according the plural various access commands. For example, the command signal SCM2 may include an access command CM1 used for performing a first access operation, and the access command CM1 is one selected from plural members of an access command group CMG. The plural members of the access command group CMG may includes a read command RM1, a write command WM1, a read-with-auto-precharge command and a write-with-auto-precharge command.

The control unit 42 receives the access command CM1 and the column-command address A1 in the clock period PD1 of the clock signal CLK. The input pointer IP is pointed at the specific latch unit $PR_A$ (e.g. $PR_0$) in the clock period PD1. The output pointer OP is pointed at the specific latch unit $PR_A$ (e.g. $PR_0$) in the clock period PD2, which is lagged behind the clock period PD1 by the period number FPN. The latch signal SLT has an enable voltage level EN1 in an enable time interval TD1, which is locked to the clock period PD1. The FIFO register 43 further receives the latch signal SLT, and utilizes the enable voltage level EN1 to output the column-command address A1 in the enable time interval TD1.

In an embodiment, the control unit 42 may include a mode register 424, a counter control device 425, an input pointer counter 426, an output pointer counter 427 and an address input buffer 422. The counter control device 425 may determine the period number FPN by itself, or utilizes the mode register 424 to determine the period number FPN, as depicted in this embodiment.

The mode register 424 receives a mode register set command MRS2, and produces a parameter signal UL2 according to the mode register set command MRS2, wherein the parameter signal UL2 includes the read latency RL2 and the write latency WL2. In an embodiment, the mode register 424 utilizes the mode register set command MRS2 to set an additive latency AL, a column address strobe latency CL or a column address strobe write latency CWL for determining the read latency RL2 and the write latency WL2 according to the additive latency AL, the column address strobe latency CL or the column address strobe write latency CWL. The determination of the read latency RL2 and the write latency WL2, and the suitable values of the additive latency AL, the column address strobe latency CL or the column address strobe write latency CWL may refer to various specifications of the DDR SDRAM devices on the market. For example, the read latency RL2 is a summation of the additive latency AL and the column address strobe latency CL, and the write latency WL2 is a summation of the additive latency AL and the column address strobe write latency CWL.

The counter control device 425 receives the command signal SCM2 and the parameter signal UL2, determines the period number FPN according to the parameter signal UL2, and produces the latch signal SLT, a reset signal RTA and a reset signal RTB according to the command signal SCM2 and the period number FPN. For example, when the access command CM1 is one of the read command RM1 and the read-with-auto-precharge command, the counter control device 425 determines the period number FPN according to the read latency RL2; when the access command CM1 is one of the write command WM1 and the write-with-auto-precharge command, the counter control device 425 determines the period number FPN according to the write latency RL2. In an embodiment, the parameter signal UL2 includes the read latency RL2, the write latency WL2, the additive latency AL, the column address strobe latency CL and the column address strobe write latency CWL; the counter control device 425 determines the period number FPN according to the additive latency AL, the column address strobe latency CL and the column address strobe write latency CWL.

The address input buffer 422 receives the input address signal CDS2, and produces the internal address signal IDS2. For the first access operation, the counter control device 425 receives the access command CM1 of the command signal SCM2 in the clock period PD1 of the clock signal CLK, and the address input buffer 422 receives the column-command address A1 of the input address signal CDS2 in the clock period PD1.

The input pointer counter 426 receives the clock signal CLK and the reset signal RTA, and produces the pointer signal SIP in response to the clock signal CLK and the reset signal RTA, wherein the input pointer IP of the pointer signal SIP has a first variable being an integer increased sequentially according to the clock signal CLK. The output pointer counter 427 receives the clock signal CLK and the reset signal RTB, and produces the pointer signal SOP in response to the clock signal CLK and the reset signal RTB, wherein the output pointer OP of the pointer signal SOP has a second variable being an integer increased sequentially according to the clock signal CLK.

The access command CM1 has an access type being one of a read type and a write type. For example, the access type of each of the read command RM1 and the read-with-auto-precharge command is the read type; the access type of each of the write command WM1 and the write-with-auto-precharge command is the write type. The command signal SCM2 may include a specific access command prior to the access command CM1, e.g. the specific access command is the previous access command of the access command CM1, wherein the specific access command (or the previous access command) has an access type being one of the read type and the write type. When the access type of the access command CM1 is different from that of the previous access command of the access command CM1, the input pointer counter 426 utilizes the reset signal RTA to reset the first variable of the input pointer IP in the clock period PD1 (e.g. the first variable is set as an integer 0), and the output pointer counter 427 utilizes the reset signal RTB to reset the second variable of the output pointer OP in the clock period PD2 (e.g. the second variable is set as an integer 0). In an embodiment, it is necessary to produce the reset signal RTA and the reset signal RTB on condition that the read operation is switched to the write operation or the write operation is switched to the read operation; it is not necessary to produce the reset signal RTA and the reset signal RTB in the condition of the sequential read operations or the sequential write operations. In other words, only when the access type of the access command CM1 is different from that of the previous access command of the access command CM1, the reset signal RTA and the reset signal RTB are produced.

In an embodiment, the DRAM device 40 may include a first control circuit (not shown) and a memory array 45. The first control circuit may include the control unit 42, the FIFO register 43 and the column address decoder 44. The first control circuit is used for controlling the column-command address A1, wherein the column-command address A1 corresponds to the specific column CA1 of the memory array 45.

Figure 4:
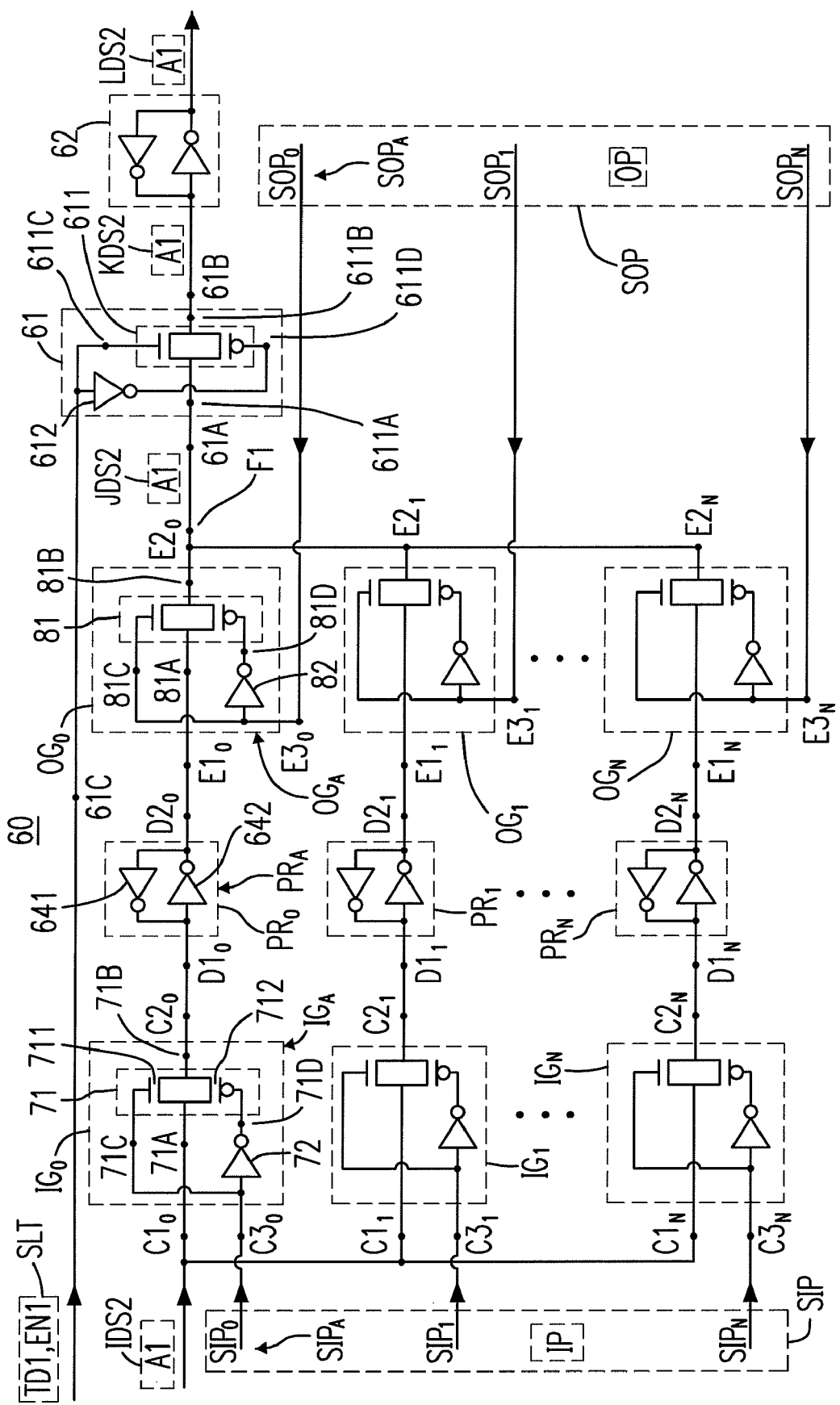
FIG. 4 is a schematic diagram showing a FIFO register according to the present invention.

Please refer to FIG. 4, which is a schematic diagram showing a FIFO register 60 according to the present invention. The FIFO register 60 is an embodiment of the FIFO register 43 in FIG. 3. As shown in FIG. 4, the FIFO register 60 includes plural sequential switches $IG_0, IG_1, \ldots$ and $IG_N$, the plural sequential latch units $PR_0, PR_1, \ldots$ and $PR_N$, plural sequential switches $OG_0, OG_1, \ldots$ and $OG_N$, a switch 61, and an output latch unit 62. The pointer signal SIP includes plural sub-signals $SIP_0, SIP_1, \ldots$ and $SIP_N$. Each of the plural input terminals $C1_0, C1_1, \ldots$ and $C1_N$ of the plural sequential switches $IG_0, IG_1, \ldots$ and $IG_N$ receives the internal address signal IDS2, the plural output terminals $C2_0, C2_1, \ldots$ and $C2_N$ of the plural sequential switches $IG_0, IG_1, \ldots$ and $IG_N$ are electrically connected to the plural input terminals $D1_0, D1_1, \ldots$ and $D1_N$ of the plural sequential latch units $PR_0, PR_1, \ldots$ and $PR_N$ respectively, and the plural control terminals $C3_0, C3_1, \ldots$ and $C3_N$ of the plural sequential switches $IG_0, IG_1, \ldots$ and $IG_N$ receives the plural sub-signals $SIP_0, SIP_1, \ldots$ and $SIP_N$ respectively. The plural sequential switches $IG_0, IG_1, \ldots$ and $IG_N$ distribute the internal address signal IDS2 to the plural sequential latch units $PR_0, PR_1, \ldots$ and $PR_N$ sequentially according to the input pointer IP of the pointer signal SIP.

The input pointer IP is pointed at the specific latch unit $PR_A$ (e.g. $PR_0$) of the plural sequential latch units $PR_0, PR_1, \ldots$ and $PR_N$ in the clock period PD1. The plural sequential switches $IG_0, IG_1, \ldots$ and $IG_N$ include a specific switch $IG_A$ (e.g. $IG_0$) having an output terminal (e.g. $C2_0$) electrically connected to the input terminal (e.g. $D1_0$) of the specific latch unit $PR_A$ (e.g. $PR_0$). The plural sub-signals $SIP_0, SIP_1, \ldots, SIP_N$ include a specific sub-signal $SIP_A$ (e.g. $SIP_0$). The input pointer IP is pointed at the specific sub-signal $SIP_A$ (e.g. $SIP_0$) in the clock period PD1 to cause the specific switch $IG_A$ (e.g. $IG_0$) to be turned on. Therefore, the column-command address A1 of the internal address signal IDS2 is written into the specific latch unit $PR_A$ (e.g. $PR_0$) in the clock period PD1.

The plural sequential switches $IG_0, IG_1, \ldots$ and $IG_N$ have the same structure. For example, the switch $IG_0$ includes a transmission gate 71 and a NOT gate 72. The input terminal 71A of the transmission gate 71 receives the internal address signal IDS2; the output terminal 71B of the transmission gate 71 electrically connected to the input terminal $D1_0$ of the latch unit $PR_0$; the first control terminal 71C of the transmission gate 71 receives the sub-signal $SIP_0$ of the pointer signal SIP, wherein the transmission gate 71 may be a CMOS switch. The transmission gate 71 may includes an NMOS transistor 711 and a PMOS transistor 712 electrically connected to the NMOS transistor 711. The input terminal of the NOT gate 72 receives the sub-signal $SIP_0$ of the pointer signal SIP, and the output terminal of the NOT gate 72 is electrically connected to the second control terminal 71D of the transmission gate 71.

The plural sequential latch units $PR_0, PR_1, \ldots$ and $PR_N$ have the same structure. For example, the latch unit $PR_0$ includes a NOT gate 641 and a NOT gate 642 connected in parallel with the NOT gate 311 in the state of the opposite direction thereof. The plural sequential latch units $PR_0, PR_1, \ldots$ and $PR_N$ represent plural sequential storage positions respectively, and the plural sequential storage positions include a specific storage position. The input pointer IP is pointed at the specific storage position in the clock period PD1, and the output pointer OP is pointed at the specific storage position in the clock period PD2.

The pointer signal SOP includes plural sub-signals $SOP_0, SOP_1, \ldots$ and $SOP_N$. The input terminals $E1_0, E1_1, \ldots$ and $E1_N$ of the plural sequential switches $OG_0, OG_1, \ldots$ and $OG_N$ are electrically connected to the output terminals of $D2_0, D2_1, \ldots$ and $D2_N$ of the plural sequential latch units $PR_0, PR_1, E1_1, \ldots$ and $PR_N$ respectively; the output terminals $E2_0, E2_1, \ldots$ and $E2_N$ of the plural sequential switches $OG_0, OG_1, \ldots$ and $OG_N$ are electrically connected into a node F1; the control terminals $E3_0, E3_1, \ldots$ and $E3_N$ of the plural sequential switches $OG_0, OG_1, \ldots$ and $OG_N$ receives the plural sub-signals $SOP_0, SOP_1, \ldots$ and $SOP_N$ respectively. The plural sequential switches $OG_0, OG_1, \ldots$ and $OG_N$ sequentially read the plural sequential latch units $PR_0, PR_1, E1_1, \ldots$ and $PR_N$ to produce an address signal JDS2 at the node F1 according to the output pointer OP of the pointer signal SOP.

The output pointer OP is pointed at the specific latch unit $PR_A$ (e.g. $PR_0$) of the plural sequential latch units $PR_0, PR_1, \ldots$ and $PR_N$ in the clock period PD2. The plural sequential switches $OG_0, OG_1, \ldots$ and $OG_N$ include a specific switch $OG_A$ (e.g. $OG_0$) having an input terminal (e.g. $E1_0$) electrically connected to the output terminal (e.g. $D2_0$) of the specific latch unit $PR_A$ (e.g. $PR_0$). The plural sub-signals $SOP_0, SOP_1, \ldots, SOP_N$ include a specific sub-signal $SOP_A$ (e.g. $SOP_0$). The output pointer OP is pointed at the specific sub-signal $SOP_A$ (e.g. $SOP_0$) in the clock period PD2 to cause the specific switch $OG_A$ (e.g. $OG_0$) to be turned on. Therefore, the column-command address A1, which is stored in the specific latch unit $PR_A$ (e.g. $PR_0$), is transmitted to the node F1, which causes the address signal JDS2 to carry the column-command address A1 in the clock period PD2.

The plural sequential switches $OG_0, OG_1, \ldots$ and $OG_N$ have the same structure. For example, the switch $OG_0$ includes a transmission gate 81 and a NOT gate 82. The input terminal 81A of the transmission gate 81 is electrically connected to the output terminal $D2_0$ of the latch unit $PR_0$; the output terminal 81B of the transmission gate 81 is electrically connected to the input terminal 61A of the switch 61; the first control terminal 81C of the transmission gate 81 receives the sub-signal $SOP_0$ of the pointer signal SOP, wherein the transmission gate 81 may be a CMOS switch. The input terminal of the NOT gate 82 receives the sub-signal $SOP_0$ of the pointer signal SOP, and the output terminal of the NOT gate 82 is electrically connected to the second control terminal 81D of the transmission gate 81.

The input terminal 61A of the switch 61 receives the address signal JDS2; the output terminal 61B of the switch 61 produces an address signal KDS2; the control terminal 61C of the switch 61 receives the latch signal SLT, wherein in the enable time interval TD1, the enable voltage level EN1 of the latch signal SLT causes the switch 61 to be turned on and causes the address signal KDS2 to carry the column-command address A1. The output latch unit 62 receives the address signal KDS2, and produces the address signal LDS2, wherein in the enable time interval TD1, the column-command address A1 of the address signal KDS2 is written into the output latch unit 62.

Figure 5:
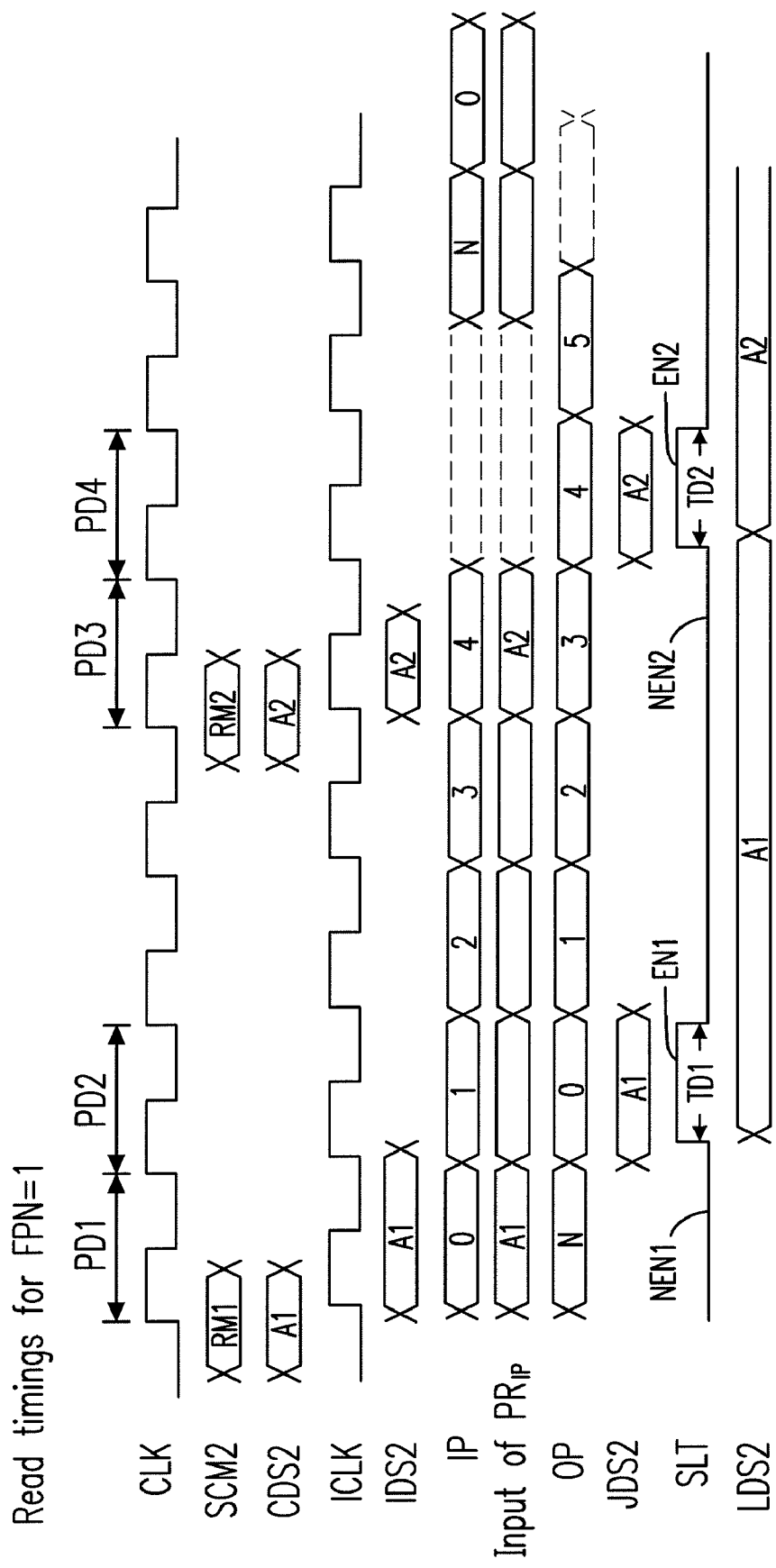
FIG. 5 is a schematic diagram showing read timings of the column-command address control according to the present invention.

Please refer to FIG. 5, which is a schematic diagram showing read timings of the column-command address control according to the present invention. The schematic diagram is drafted according to the read operation of the DRAM device 40. The plural waveforms in FIG. 5 represent signals of the clock signal CLK, the command signal SCM2, the input address signal CDS2, the internal clock signal ICLK, the internal address signal IDS2, the input pointer IP, the input of the latch unit $PR_{IP}$ at which the input pointer IP points, the output pointer OP, the address signal JDS2, the latch signal SLT and the address signal LDS2 respectively when the period number is 1, wherein the internal clock signal ICLK is a signal, which is output by an input buffer (not shown) in response to the clock signal CLK, and is provided to the inside of the DRAM device 40. In order to simply illustrate the features of the present invention, the following conditions are set into FIG. 5. The read latency RL2 is set to be a value of 1 according to the additive latency AL and the column address strobe latency CL, and the period number FPN is determined to be a value of 1 according to the read latency RL2.

As shown, in the clock period PD1, e.g. at the starting time point of the clock period PD1, of the clock signal CLK, the counter control device 425 receives the read command RM1, and the address input buffer 422 receives the column-command address A1 of the input address signal CDS2 simultaneously, wherein the column-command address A1 is a column address used for reading the specific column CA1 of the memory array 45. There are the following features in the clock period PD1. The internal address signal IDS2 has the column-command address A1. The FIFO register 43 receives the column-command address A1. The input pointer IP has the value of 0, i.e., the input pointer IP is pointed at the latch unit $PR_0$; thus the column-command address A1 is written into the latch unit $PR_0$. The output pointer OP is synchronous with the input pointer IP but is lagged behind the input pointer IP by the period number FPN (having the value of 1); the output pointer OP has the value of N and is pointed at the latch unit $PR_N$ simultaneously; the address signal JDS2 has the value produced at the output terminal $D2_N$ of the latch unit $PR_N$. The latch signal SLT has the disable voltage level NEN1, which causes the switch 61 to be turned off; thus the address signal LDS2 does not have the value produced at the output terminal $D2_N$ of the latch unit $PR_N$ in the clock period PD1.

The clock period PD2 is lagged behind the clock period PD1 by the period number FPN (having the value of 1). There are the following features in the clock period PD2; the input pointer IP has the value of 1; the output pointer OP has the value of 0, and is pointed at the latch unit $PR_0$; the address signal JDS2 has the column-command address A1 produced at the output terminal $D2_0$ of the latch unit $PR_0$; the enable time interval TD1 is locked to the clock period PD2, e.g. the enable time interval TD1 is disposed within the clock period PD2; the latch signal SLT has the enable voltage level EN1 in the enable time interval TD1, which causes the switch 61 to be turned on; thus the column-command address A1 of the address signal JDS2 is written into the output latch unit 62 in the enable time interval TD1. The DRAM device (e.g. DDR SDRAM device) has a parameter of the burst length BL (e.g. BL=8), and reads a number of BL memory cells of the memory array in the time interval of one read operation. When the read operation of the read command RM1 is finished, the DRAM device 40 may performs the read operation of the read command RM2 next.

There are the following features in the clock period PD3. The counter control device 425 receives the read command RM2, and the address input buffer 422 receives the column-command address A2 of the input address signal CDS2 simultaneously. The input pointer IP has the value of 4, and the column-command address A2 is written into the latch unit $PR_4$. The output pointer OP is pointed at the latch unit $PR_3$; the address signal JDS2 has the value produced at the output terminal $D2_3$ of the latch unit $PR_3$. The latch signal SLT has the disable voltage level NEN2, which causes the switch 61 to be turned off; thus the address signal LDS2 does not have the value produced at the output terminal $D2_3$ of the latch unit $PR_3$ in the clock period PD3.

The clock period PD4 is lagged behind the clock period PD3 by the period number FPN (having the value of 1). There are the following features in the clock period PD4; the output pointer OP has the value of 4; the address signal JDS2 has the column-command address A2; the enable time interval TD2 is locked to the clock period PD4, e.g., the enable time interval TD2 is disposed within the clock period PD4; the latch signal SLT has the enable voltage level EN2 in the enable time interval TD2, which causes the switch 61 to be turned on; thus the column-command address A2 of the address signal JDS2 is written into the output latch unit 62 in the enable time interval TD2.

Figure 6:
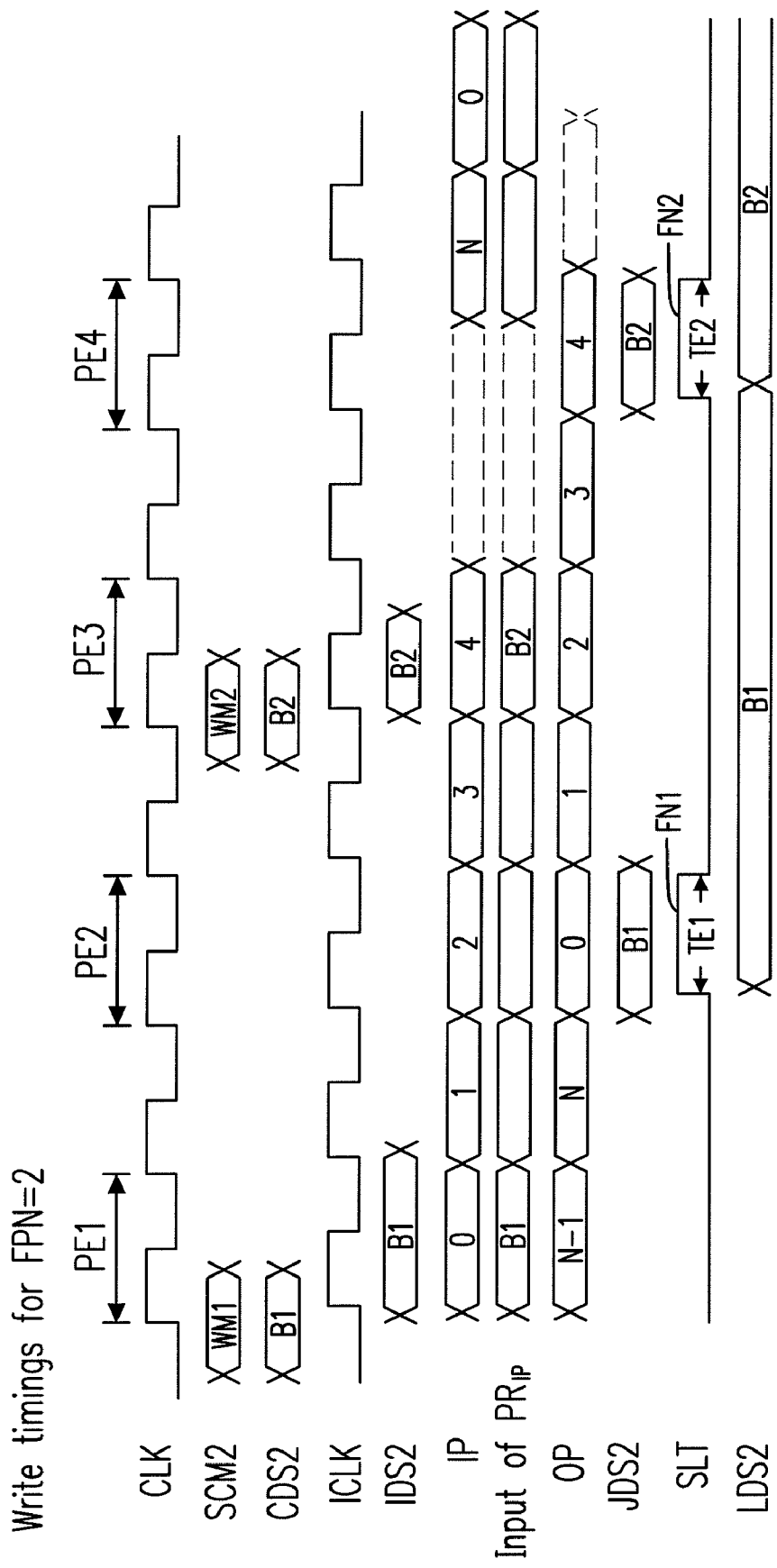
FIG. 6 is a schematic diagram showing write timings of the column-command address control according to the present invention.

Please refer to FIG. 6, which is a schematic diagram showing write timings of the column-command address control according to the present invention. The schematic diagram is drafted according to the write operation of the DRAM device 40. The plural waveforms in FIG. 6 represent signals of the clock signal CLK, the command signal SCM2, the input address signal CDS2, the internal clock signal ICLK, the internal address signal IDS2, the input pointer IP, the input of the latch unit $PR_{IP}$ at which the input pointer IP points, the output pointer OP, the address signal JDS2, the latch signal SLT and the address signal LDS2 respectively when the period number is 2. In order to simply illustrate the features of the present invention, the following conditions are set into FIG. 6. The write latency WL2 is set to be a value of 2 according to the additive latency AL and the column address strobe write latency CWL, and the period number FPN is determined to be a value of 2 according to the write latency WL2.

As shown, in the clock period PE1, e.g. at the starting time point of the clock period PE1, of the clock signal CLK, the counter control device 425 receives the write command WM1, and the address input buffer 422 receives the column-command address B1 of the input address signal CDS2 simultaneously, wherein the column-command address B1 is a column address used for writing data into plural columns of the memory array 45, the plural columns includes a specific column corresponding to the column-command address B1, and the length of the data is specified by the burst length BL. In the clock period PE1, the input pointer IP is pointed at the latch unit $PR_0$, thus the column-command address B1 is written into the latch unit $PR_0$.

The clock period PE2 is lagged behind the clock period PE1 by the period number FPN (having the value of 2). There are the following features in the clock period PE2; the output pointer OP is pointed at the latch unit $PR_0$; the address signal JDS2 has the column-command address B1 produced at the output terminal $D2_0$ of the latch unit $PR_0$; the latch signal SLT has the enable voltage level FN1 in the enable time interval TE1, which causes the switch 61 to be turned on; thus the column-command address B1 of the address signal JDS2 is written into the output latch unit 62 in the enable time interval TE1.

In the clock period PE3, the counter control device 425 receives the write command WM2, and the address input buffer 422 receives the column-command address B2 of the input address signal CDS2 simultaneously. The clock period PE4 is lagged behind the clock period PE3 by the period number FPN (having the value of 2), and the enable time interval TE2 is locked to the clock period PE4. The latch signal SLT has the enable voltage level FN2 in the enable time interval TE2, which causes the switch 61 to be turned on; thus the column-command address B2 of the address signal JDS2 is written into the output latch unit 62 in the enable time interval TE2.

In the present invention, the latency controls of the column-command addresses for the read operations and the write operations of the DRAM device 40 are integrated by using the counter control device 425, the input pointer counter 426, the output pointer counter 427 and the FIFO register 43 so as to accomplish the effect of simplifying the circuit design.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A circuit for controlling a column-command address corresponding to a specific column of a dynamic random access memory (DRAM) array, comprising:
    a control unit having a clock signal, setting at least one of a read latency and a write latency to determine a period number, and synchronously producing an input pointer and an output pointer according to the period number and the clock signal, wherein the output pointer is lagged behind the input pointer by the period number associated with the clock signal, and a time that the output pointer is reset is lagged behind a time that the input pointer is reset by the period number associated with the clock signal; and
    a first-in first-out (FIFO) register having plural sequential latch units including a specific latch unit, receiving the column-command address and the input and the output pointers, writing the column-command address into the specific latch unit when the input pointer is pointed at the specific latch unit, and reading the specific latch unit to output the column-command address by using the output pointer.

2. A circuit according to claim 1, wherein:
    the control unit further produces an internal address signal, a first pointer signal, a second pointer signal and a latch signal in response to the clock signal, a command signal, an input address signal and the period number, wherein the clock signal has a first clock period and a second clock period lagged behind the first clock period by the period number;
    the command signal includes a first access command;
    each of the input address and the internal address signals includes the column-command address;
    the first pointer signal includes the input pointer and plural sub-signals containing a specific sub-signal, and the second pointer signal includes the output pointer and plural sub-signals containing a specific sub-signal;
    the internal address, the first pointer and the second pointer signals are provided to the FIFO register;
    the control unit receives the first access command and the column-command address in the first clock period;
    the first access command is one of a read command and a write command;
    the input pointer is pointed at the specific latch unit in the first clock period;
    the output pointer is pointed at the specific latch unit in the second clock period;
    the latch signal has an enable voltage level in an enable time interval locked to the second clock period; and
    the FIFO register further receives the latch signal, and utilizes the enable voltage level to output the column-command address in the enable time interval.

3. A circuit according to claim 2, wherein the control unit comprises:
    a mode register receiving a mode register set command to produce a parameter signal including the read latency and the write latency;
    a counter control device receiving the command signal and the parameter signal, determining the period number according to the parameter signal, and producing the latch signal, a first reset signal and a second reset signal according to the command signal and the period number;
    an input pointer counter producing the first pointer signal in response to the clock signal and the first reset signal;
    an output pointer counter producing the second pointer signal in response to the clock signal and the second reset signal; and
    an address input buffer receiving the input address signal, and producing the internal address signal.

4. A circuit according to claim 3, wherein:
    the period number is determined depending on at least one of the read latency and the write latency;
    the mode register further sets an additive latency, a column address strobe latency and a column address strobe write latency for determining the read latency and the write latency;
    the read latency is a summation of the additive latency and the column address strobe latency, and the write latency is a summation of the additive latency and the column address strobe write latency; and
    in the first clock period, the counter control device receives the first access command, and the address input buffer receives the column-command address.

5. A circuit according to claim 3, wherein:
the input pointer has a first variable being an integer increased sequentially according to the clock signal;
the output pointer has a second variable being an integer increased sequentially according to the clock signal;
the first access command has an access type being one of a read type and a write type;
the command signal further includes a second access command prior to the first access command, wherein the second access command has an access type being one of the read type and the write type; and
only when the access type of the first access command is different from that of the second access command, the first reset signal and the second reset signal are produced, the input pointer counter utilizes the first reset signal to reset the first variable in the first clock period, and the output pointer counter utilizes the second reset signal to reset the second variable in the second clock period.

6. A circuit according to claim 3, wherein:
the mode register further sets an additive latency, a column address strobe latency and a column address strobe write latency;
the parameter signal further includes the additive latency, the column address strobe latency and the column address strobe write latency; and
the period number is determined depending on the additive latency, the column address strobe latency and the column address strobe write latency.

7. A circuit according to claim 2, wherein each of the plural sequential latch units has an input terminal and an output terminal, the specific latch unit has an input terminal and an output terminal, and the FIFO register further comprises:
plural sequential first switches, each of which includes:
an input terminal receiving the internal address signal;
an output terminal electrically connected to the input terminal of one of the plural sequential latch units correspondingly; and
a control terminal receiving one of the plural sub-signals of the first pointer signal correspondingly, wherein the plural sequential first switches distribute the internal address signal to the plural sequential latch units sequentially according to the input pointer of the first pointer signal;
plural sequential second switches, each of which includes:
an input terminal electrically connected to the output terminal of one of the plural sequential latch units correspondingly;
an output terminal electrically connected into a node; and
a control terminal receiving one of the plural sub-signals of the second pointer signal correspondingly, wherein the plural sequential second switches sequentially read the plural sequential latch units to produce a first address signal at the node according to the output pointer of the second pointer signal;
a third switch having an input terminal receiving the first address signal, an output terminal producing a second address signal, and a control terminal receiving the latch signal, wherein in the enable time interval, the enable voltage level of the latch signal causes the third switch to be turned on and causes the second address signal to carry the column-command address; and
an output latch unit receiving the second address signal, and producing a third address signal, wherein in the enable time interval, the column-command address of the second address signal is written into the output latch unit.

8. A circuit according to claim 7, wherein:
the plural sequential first switches include a specific switch having an output terminal electrically connected to the input terminal of the specific latch unit; and
the input pointer is further pointed at the specific sub-signal of the first pointer signal to cause the specific switch to be turned on.

9. A circuit according to claim 8, wherein the specific switch comprises:
a transmission gate having an input terminal receiving the internal address signal, an output terminal electrically connected to the input terminal of the specific latch unit, a first control terminal receiving the specific sub-signal of the first pointer signal, and a second control terminal, wherein the transmission gate is a CMOS switch; and
a NOT gate having an input terminal receiving the specific sub-signal of the first pointer signal, and an output terminal electrically connected to the second control terminal of the transmission gate.

10. A circuit according to claim 7, wherein:
the plural sequential second switches include a specific switch having an input terminal electrically connected to the output terminal of the specific latch unit; and
the output pointer is further pointed at the specific sub-signal of the second pointer signal to cause the specific switch to be turned on.

11. A circuit according to claim 10, wherein the specific switch comprises:
a transmission gate having an input terminal electrically connected to the output terminal of the specific latch unit, an output terminal electrically connected to the input terminal of the third switch, a first control terminal receiving the specific sub-signal of the second pointer signal, and a second control terminal, wherein the transmission gate is a CMOS switch; and
a NOT gate having an input terminal receiving the specific sub-signal of the second pointer signal, and an output terminal electrically connected to the second control terminal of the transmission gate.

12. A circuit according to claim 7, wherein the third switch comprises:
a transmission gate having an input terminal receiving the first address signal, an output terminal producing the second address signal, a first control terminal receiving the latch signal, and a second control terminal, wherein the transmission gate is a CMOS switch; and
a NOT gate having an input terminal receiving the latch signal, and an output terminal electrically connected to the second control terminal of the transmission gate.

13. A circuit according to claim 1, wherein:
the DRAM array is a double data rate synchronous dynamic random access memory (DDR SDRAM) array;
the circuit for controlling the column-command address further comprises a column address decoder; and
the column address decoder receives the column-command address outputted from the FIFO register, and selects the specific column of the DRAM array according to the column-command address.

14. A circuit for controlling a column-command address corresponding to a specific column of a DRAM array, comprising:
a control unit having a clock signal, determining a period number, and synchronously producing an input pointer and an output pointer according to the period number and the clock signal, wherein the output pointer is lagged behind the input pointer by the period number associated with the clock signal, and a time that the output pointer is reset is lagged behind a time that the input pointer is reset by the period number associated with the clock signal; and a FIFO register utilizing the input pointer to store the column-command address, and utilizing the output pointer to output the column-command address.

15. A circuit according to claim 14, wherein:

the control unit further sets at least one of a read latency and a write latency for determining the period number, and produces an internal address signal, a first pointer signal, a second pointer signal and a latch signal in response to the clock signal, a command signal, an input address signal and the period number, wherein the clock signal has a first clock period and a second clock period lagged behind the first clock period by the period number;

the FIFO register comprises plural sequential latch units including a specific latch unit;

the latch signal has an enable voltage level; and the FIFO register further receives the latch signal, writes the column-command address into the specific latch unit when the input pointer is pointed at the specific latch unit, and utilizes the enable voltage level to output the column-command address.

16. A circuit according to claim 15, wherein:

the DRAM array is a DDR SDRAM array;

the command signal includes a first access command;

each of the input address and the internal address signals includes the column-command address;

the first pointer signal includes the input pointer and plural sub-signals, and the second pointer signal includes the output pointer and plural sub-signals;

the internal address, the first pointer and the second pointer signals are provided to the FIFO register;

the control unit receives the first access command and the column-command address in the first clock period;

the first access command is one of a read command and a write command;

the input pointer is pointed at the specific latch unit in the first clock period;

the output pointer is pointed at the specific latch unit in the second clock period; and the latch signal has the enable voltage level in an enable time interval locked to the second clock period.

* * * * *